United States Patent
Kitou et al.

[11] Patent Number: 5,944,890
[45] Date of Patent: Aug. 31, 1999

[54] METHOD OF PRODUCING SINGLE CRYSTALS AND A SEED CRYSTAL USED IN THE METHOD

[75] Inventors: Yasuo Kitou, Okazaki; Naohiro Sugiyama, Nagoya; Atsuto Okamoto, Nagoya; Toshihiko Tani, Nagoya; Nobuo Kamiya, Nisshin, all of Japan

[73] Assignee: Denso Corporation, Kariya, Japan

[21] Appl. No.: 08/829,449

[22] Filed: Mar. 28, 1997

[30] Foreign Application Priority Data

Mar. 29, 1996 [JP] Japan .................................. 8-075776
Mar. 29, 1996 [JP] Japan .................................. 8-103581

[51] Int. Cl.⁶ .................................................. C30B 25/02
[52] U.S. Cl. .................................................. 117/101
[58] Field of Search .................. 117/94, 95, 97, 117/101

[56] References Cited

U.S. PATENT DOCUMENTS

| | | | |
|---|---|---|---|
| 4,137,108 | 1/1979 | Ihara et al. | 117/91 |
| 4,147,572 | 4/1979 | Vodakov et al. | 117/84 |
| 4,556,436 | 12/1985 | Addamiano | 117/105 |
| 4,728,389 | 3/1988 | Logar | 117/94 |
| 4,866,005 | 9/1989 | Davis et al. | 117/98 |
| 5,037,502 | 8/1991 | Suzuki et al. | 117/84 |
| 5,162,255 | 11/1992 | Ito et al. | 117/95 |
| 5,441,011 | 8/1995 | Takahaski et al. | 117/84 |
| 5,501,173 | 3/1996 | Burk, Jr. et al. | 117/84 |

FOREIGN PATENT DOCUMENTS

| | | |
|---|---|---|
| 55-144499 | 11/1980 | Japan . |
| 61-222992 | 10/1986 | Japan . |
| 63-057400 | 11/1988 | Japan . |
| 6-048898 | 2/1994 | Japan . |
| 9-268096 | 10/1997 | Japan . |

OTHER PUBLICATIONS

Yoo, et al: "Single Grystal Growth of Hexagonal SiC on Cubic SiC by Intentional Polytype Control", Journal of Crystal Growth 99 (1990) 278–283.

Tairov et al: "General Principles of Growing Large–Size Single Crystals of Various Silicon Carbide Polytypes", Journal of Crystal Growth 52 (1981) 146–150.

Tairov et al: "Investigation of Growth Processes of Ingots of Silicon Carbide Single Crystals", Journal of Crystal Growth 43 (1978) 209–212.

*Primary Examiner*—Felisa Hiteshew
*Attorney, Agent, or Firm*—Pillsbury Madison & Sutro LLP

[57] ABSTRACT

In a method of producing single crystals on a seed crystal, the seed crystal is covered by a protection layer except for a surface on which the single crystals are to be formed. The protection layer is made of material such as carbon or the like, which is stable in a step of forming the single crystals. As a result, a temperature gradient and mass transfer in the seed crystal can be prevented, whereby quality of the single crystals formed on the seed crystal can be improved.

21 Claims, 6 Drawing Sheets

FIG. 1 PRIOR ART
FIG. 4
COMPARATIVE EXAMPLE
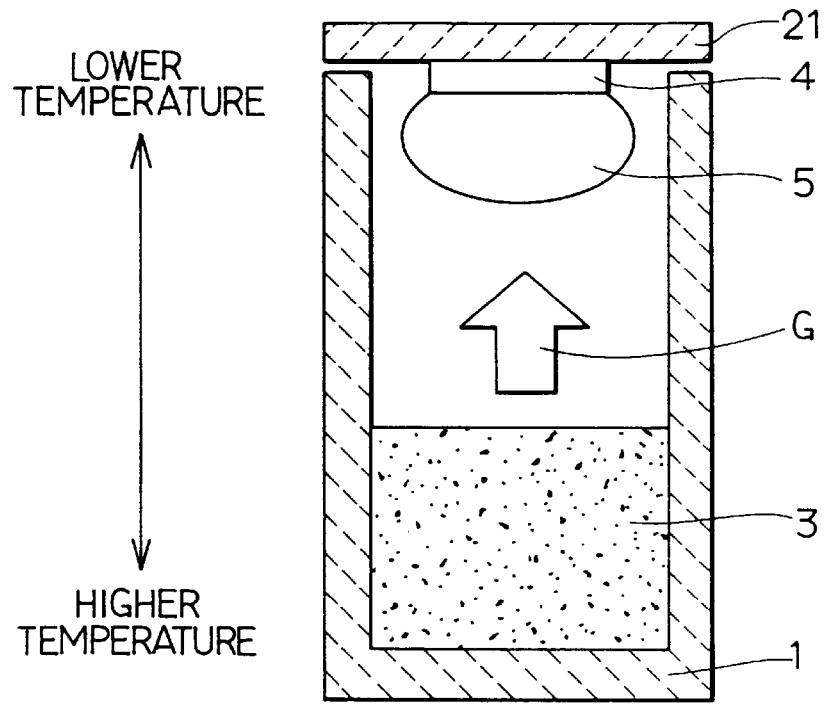
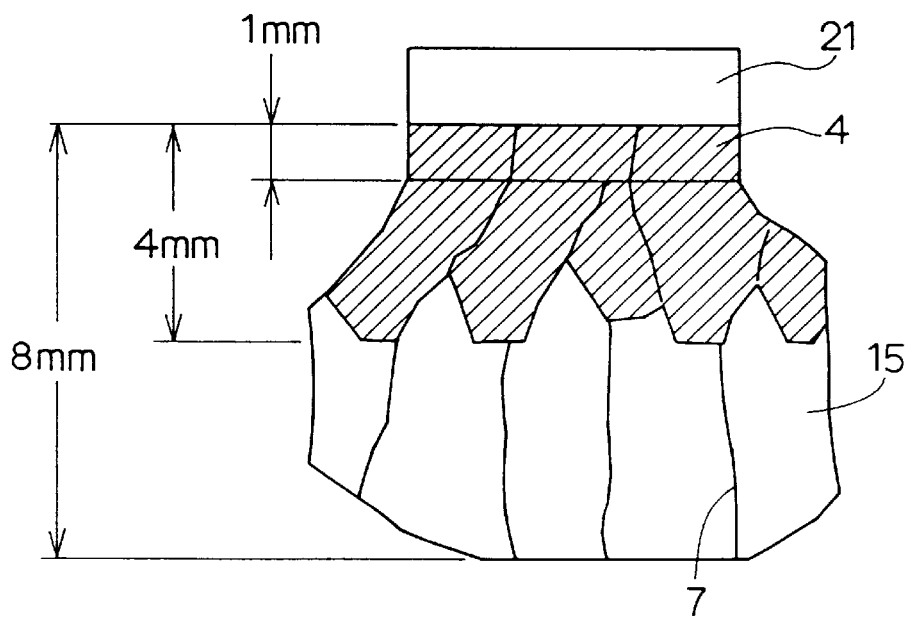

METHOD OF PRODUCING SINGLE CRYSTALS AND A SEED CRYSTAL USED IN THE METHOD

CROSS REFERENCE TO RELATED APPLICATION

This application is based upon and claims the benefit of priority of the prior Japanese Patent Applications No. 8-75776 filed on Mar. 29, 1996, and No. 8-103581 filed on Mar. 29, 1996, the contents of which are incorporated herein by reference.

BACKGROUND OF THE INVENTION

1. Field of the Invention

The present invention relates to a method of producing single crystals of silicon carbide or the like and a seed crystal used in the method.

2. Related Arts

Single-crystal silicon carbide (SiC) is useful for a substrate of a semiconductor device. As a method for producing the single-crystal SiC, the sublimation method in which source material powder is sublimated to be redeposited on a seed crystal is conventionally adopted, as reported in "Journal of Crystal Growth 43", 1978, PP. 209–212, for example. FIG. 1 schematically shows an apparatus used in the sublimation method. The apparatus includes a graphite crucible composed of a vessel 1 and a lid (a base) 2. SiC source material powder 3 is held in the vessel 1 so that a volume of the SiC source material powder 3 does not exceed a half volume of the vessel 1. On the lower face of the lid 2 is fixed a seed crystal 4 to oppose to the SiC source material powder 3. In a state that a temperature of the seed crystal 4 is kept to be lower than a temperature of the SiC source material powder 3 within the graphite crucible, the SiC source material powder 3 is sublimated. The gas sublimated from the SiC source material powder 3 is recrystallized on the seed crystal 4 to form single crystals 5.

In the above-mentioned method, the seed crystal 4 is usually bonded to the lid 2 through adhesives. In this case, however, it is difficult to bond the seed crystal 4 to the lid 2 without making any spaces therebetween due to low processing accuracy of the lid 2 and existence of the adhesives. Because of this, temperature of a surface of the seed crystal 4 bonded to the lid 2 (a bonding surface) becomes non-uniform depending on the area therein, thereby giving rise to recrystallization on the bonding surface of the seed crystal 4. The recrystallization starts from a lower temperature portion of the bonding surface, resulting in defects in the seed crystal 4. The seed crystal 4 further has a temperature gradient in a thickness direction thereof, and the temperature gradient functions as a driving power to develop the recrystallization in the seed crystal 4. Therefore, there is a possibility that the recrystallization reaches the other surface of the seed crystal 4 (a crystal growth surface) on which the single crystals 5 are formed.

This mechanism will be explained referring to FIGS. 2A to 2C. FIG. 2A shows a space formed between the seed crystal 4 and the base 21 due to the adhesives 6. In the process of growing the single crystals 5 by the sublimation method, the source material is kept at a higher temperature, while the seed crystal 4 is kept at a lower temperature. Therefore, a temperature gradient is generated in the entire portion in a crucible holding the seed crystal 4 and the source material. The temperature gradient also exists between the seed crystal 4 and the base 21 as well as inside the seed crystal 4.

Under this situation, when the seed crystal 4 is exposed to the space, sublimation and redeposition of SiC from the seed crystal 4 and surface diffusion of SiC on the surface of the seed crystal 4 occur so that SiC moves from a higher temperature portion to a lower temperature portion. For example, SiC moves from the seed crystal 4 to the base 21 and recrystallizes on the base 21 as shown in FIG. 2B. These phenomena accompany voids 41 in the seed crystal 4. In the seed crystal 4, SiC moves to occupy the voids 41 from the much higher temperature portion, thereby producing other voids 41 successively. Thus mass transfer of SiC progresses successively.

Consequently, the voids 41 exist between the recrystallized portion 42 and the other portion in which the mass transfer of SiC did not occur. The recrystallization occurs at several portions in the bonding surface of the seed crystal 4, and crystalinity of the recrystallized portion 42 is low. Further, the mass transfer of SiC is likely to occurs in defect part in the seed crystal 4, so that pipe-like defects (micro-pipe defects) 7 are generated to extend into the single crystals 5 formed on the seed crystal 4 as shown in FIG. 2C. As a result, crystalinity of the single crystals 5 is lowered, resulting in deterioration of yield factor of the single crystals 5.

SUMMARY OF THE INVENTION

The present invention has been made in view of the above-mentioned problems and an object of the present invention is to provide a method of producing single crystals on a seed crystal with high quality and high yield factor. More particularly, the object of the present invention is to prevent recrystallization inside the seed crystal not to generate any defects such as micro-pipe defects in the single crystals formed on the seed crystal as well as inside the seed crystal.

In a method of producing single crystals on a seed crystal according to the present invention, a protection layer is formed on the seed crystal on an opposite surface with respect to a growth surface of the seed crystal on which the single crystals are to be formed. Thereafter, source gas for the single crystals is supplied to the seed crystal, thereby forming the single crystals on the seed crystal. The protection layer is made of material stable in the step of forming the single crystals on the seed crystal.

In the step of forming the single crystals, for atoms constituting the seed crystal to move on the surface or outside of the seed crystal, it is necessary to pass through the protection layer. However, resistance for passing through the protection layer is large. Therefore, mass transfer inside the seed crystal and recrystallization caused by the mass transfer can be prevented by the protection layer, thereby preventing deterioration of quality and occurrence of micro-pipe defects caused by recrystallization in the seed crystal. As a result, the single crystals can be formed on the seed crystal with high quality and high yield factor.

Preferably, the protection layer is formed on an entire area of the seed crystal except for an area on which the single crystals are to be formed. In this case, the same effects as mentioned above can be attained.

More preferably, the protection layer keeps its solid phase at 2300° C. Concretely, it is desirable that the protection layer is composed of at least one selected from a group consisting of carbon, high melting point metals, and carbide, boride, and nitride of the high melting point metals. The high melting point metals include tantalum, tungsten, niobium, molybdenum, rhenium, osmium, iridium and the like.

In a case that the seed crystal is made of silicon carbide, it is desirable that the protection layer is made of graphite having a C plane orientation so that a C plane of the protection layer is parallel to a C plane of the seed crystal.

In a case that the seed crystal is bonded to a base by utilizing adhesives through the protection layer made of the above-mentioned material, wettability of the protection layer to the adhesives is generally better than that of the seed crystal. Therefore, the seed crystal can be uniformly bonded to the base by the adhesives, whereby a temperature gradient in the seed crystal and a temperature distribution on the surface of the seed crystal are suppressed. As a result, recrystallization inside the seed crystal which is promoted by the temperature gradient and the temperature distribution can be suppressed. Further, the protection layer has a heat insulation effect, whereby the temperature gradient and the temperature distribution are further suppressed.

The protection layer may be formed on the seed crystal made of silicon carbide through a sacrifice layer. In this case, firstly, a first and a second sacrifice layers are formed on both surfaces of the seed crystal, and then, a first and a second carbonized layers are formed on the first and second sacrifice layers, respectively. Thereafter, the first sacrifice layer and the first carbonized layer are removed to expose a surface of the seed crystal. The seed crystal is fixed on a base through the second sacrifice layer and the second carbonized layer in a growth apparatus, and then, source gas is supplied to the seed crystal, thereby forming single-crystal silicon carbide on the seed crystal.

In these steps, the seed crystal can keep its thickness without being carbonized due to the first and second sacrifice layers.

Preferably, the first and second sacrifice layer are made of polycrystal silicon carbide, whereby it is prevented that impurities invade the seed crystal. Further, polycrystal silicon carbide can be formed easily compared to single-crystal silicon carbide.

In a case that a sublimation method is employed for forming single-crystal silicon carbide, the source gas is obtained by sublimating silicon carbide source material, while a temperature of the seed crystal is controlled to be lower than a temperature of the silicon carbide source material. In this case, the carbonized layer equalizes a temperature distribution on the surface of the seed crystal, while functioning a barrier layer for preventing mass transfer inside the seed crystal. As a result, occurrence of defects in the seed crystal and in single-crystal silicon carbide formed on the seed crystal can be prevented. Further, because single-crystal silicon carbide is formed on the seed crystal by the sublimation method, single-crystal silicon carbide can be formed to have a sufficient thickness suitable for a semiconductor substrate, resulting in low cost and mass production.

Preferably, the seed crystal is obtained by forming on a silicon single-crystal substrate. In this case, a diameter of the seed crystal is substantially equal to a diameter of the silicon single-crystal substrate. In the present level of the art, it is easy to get the silicon single-crystal substrate having a diameter of 8 to 10 inches. Therefore, single-crystal silicon carbide having the diameter of 8 to 10 can be obtained.

In the case that the seed crystal is formed on the silicon single-crystal substrate, after the first sacrifice layer is formed on the seed crystal, the silicon single-crystal substrate is removed. In this case, the first sacrifice layer functions as a reinforcement member for preventing the seed crystal from being damaged. The second sacrifice layer is formed on a surface of the seed crystal which is exposed by removing the silicon single-crystal substrate. Thereafter, the first and second carbonized layers are formed on the first and second sacrifice layers, respectively.

The first and second carbonized layers can be formed on the first and second sacrifice layers by heating in an atmosphere including inert gas.

Other objects and features of the present invention will become more readily apparent from a better understanding of the preferred embodiments described below with reference to the following drawings.

BRIEF DESCRIPTION OF THE DRAWINGS

FIG. 1 is a cross-sectional view showing a growth apparatus for producing single crystals according to a prior art;

FIG. 4 is a schematic view showing single crystals formed on a seed crystal in a comparative example;

DETAILED DESCRIPTION OF THE PREFERRED EMBODIMENTS

Methods for producing single-crystal silicon carbide (SiC) according to the present invention will be described hereinunder with reference to the drawings. The present invention is applicable to a producing method for every single crystals which can be produced by the sublimation method or the other method in which a temperature gradient occurs in a seed crystal. For example, single-crystals of cadmium sulfide (CdS), cadmium selenide (CdSe), zinc sulfide (ZnS), aluminum nitride (AlN), boron nitride (BN) and the like can be produced according to the present invention.

Figure 2A:
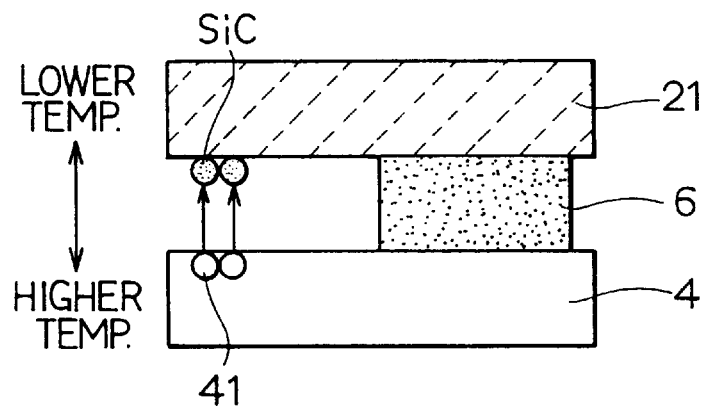
FIG. 2A is a cross-sectional view for explaining a mechanism of recrystallization of a seed crystal in the prior art.
Figure 2B:
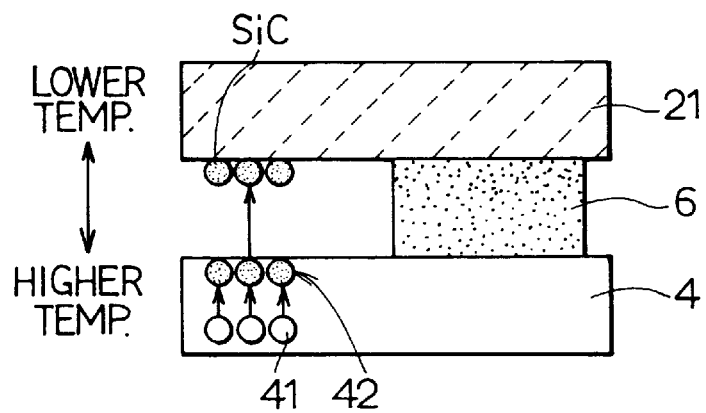
FIG. 2B is a cross-sectional view for explaining the mechanism of recrystallization of the seed crystal in the prior art.
Figure 2C:
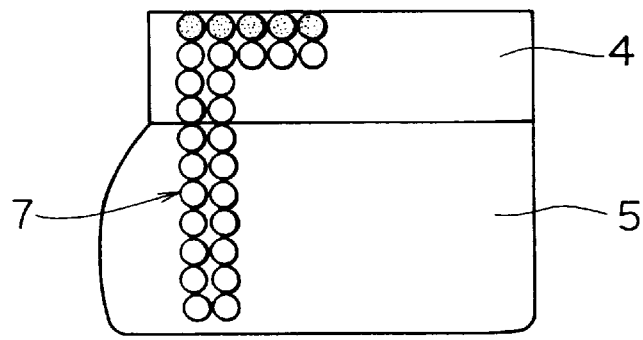
FIG. 2C is a cross-sectional view for explaining a mechanism of occurrence of a micro-pipe defect in the seed crystal and in single crystals formed on the seed crystal in the prior art.
Figure 3A:
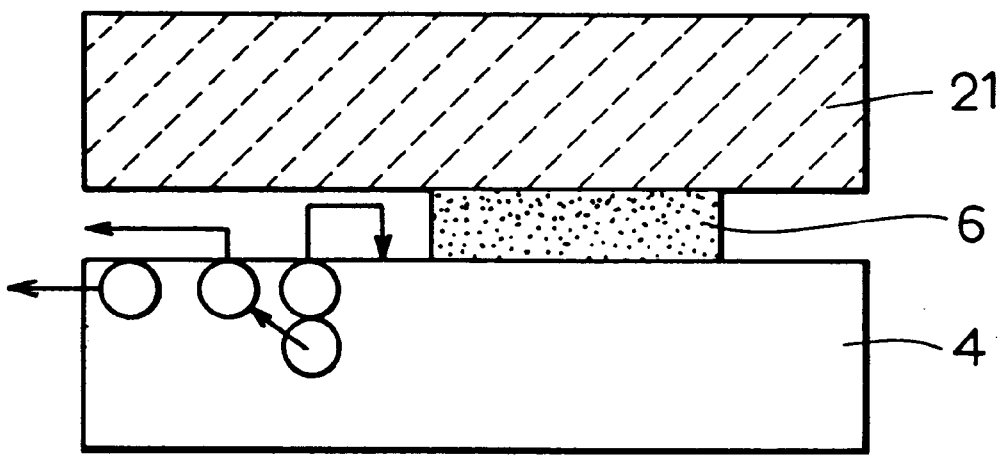
FIG. 3A is a cross-sectional view for explaining mass transfer inside the seed crystal in the prior art.

Firstly, a first embodiment will be explained. In the first embodiment, a single-crystal layer produced in advance by the Acheson method, the sublimation method or the like is prepared as a seed crystal 4. The seed crystal 4 is usually formed into a disk-like shape to correspond to a shape of a graphite base 21, and then, is bonded to the graphite base 21 through adhesives 6 as shown in FIG. 3A. In this state, gaseous source material is supplied on the surface of the seed crystal 4, thereby growing single crystals 5 on the seed crystal 4.

In this case, however, it is difficult to bond the seed crystal 4 on the graphite base 21 without any spaces. Therefore, when the single crystals 5 are grown on the surface of the seed crystal 4 (a crystal growth surface), the other surface of the seed crystal 4 contacting the graphite base 21 (a base bonding surface) is etched due to the spaces between the seed crystal 4 and the graphite base 21. The single crystals 5 further grow in a direction perpendicular to a side face of the seed crystal 4. On the base bonding surface of the seed crystal 4, SiC is sublimated from the seed crystal 4 to recrystallize on the surface of the base 21 or on the other part of the base bonding surface of the seed crystal 4, where the temperature is lower than that of the sublimated part.

Figure 3B:
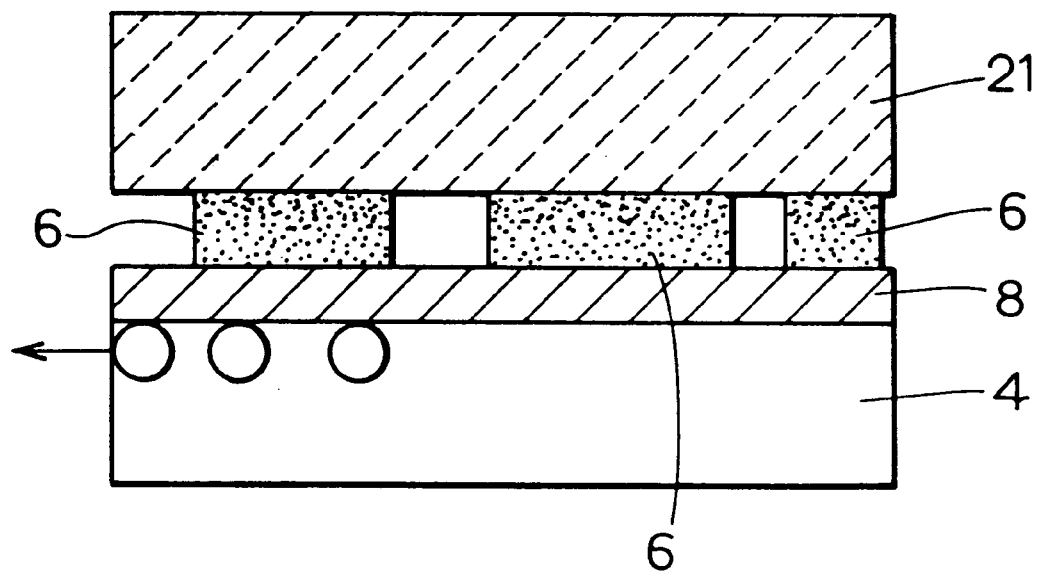
FIG. 3B is a cross-sectional view for explaining an effect of preventing mass transfer inside a seed crystal in a first embodiment according to the present invention.

To solve the above-mentioned problem, in the first embodiment, before the seed crystal 4 is bonded to the base 21, a protection layer 8 is formed on the seed crystal 4 to cover the seed crystal 4 except for the crystal growth surface. That is, the base bonding surface of the seed crystal 4 is entirely covered by the protection layer 8 as shown in FIG. 3B. In the case that the single crystals 5 grow on the side faces of the seed crystal 4, the side faces do not need to be covered by the protection layer 8. The crystal growth surface of the seed crystal 4 on which the single crystals 5 grow is influenced by a structure of a vessel and the like. That is, the area on which the protection layer 8 is to be formed is changed on the basis of a structure of an apparatus and the like utilized in the process. In all cases, at least the surface of the seed crystal 4 except for the crystal growth surface is covered by the protection layer 8. If necessary, the protection layer 8 may be formed on the crystal growth surface. For example, to grow the single crystals 5 only at the center portion of the crystal growth surface, the other surfaces including the periphery of the crystal growth surface and the side faces of the seed crystal 4 may be covered by the protection layer 8.

The protection layer 8 is made of material stable under growth conditions. That is, the protection layer 8 is generally made of material having a melting point higher than a growth temperature of the single crystals 5. SiC crystal usually grows approximately at 2300° C. Therefore, when single-crystal SiC is formed, the material constituting the protection layer 8 needs to keep its solid phase at 2300° C. Concretely, the applicable material for constituting the protection layer 8 is at least one selected from a group consisting of carbon (C), high melting point metals, and compounds of the metals, such as carbide, boride, nitride and the like. The high melting point metals include tantalum (Ta), tungsten (W), niobium (Nb), molybdenum (Mo), rhenium (Re), osmium (Os), iridium (Ir) and the like.

The method for forming the protection layer 8 is not limited to a certain method, and it may be a physical deposition, chemical deposition, coating or the like. The protection layer 8 made of carbon can be formed on the SiC seed crystal 4 by heat processing of SiC itself in addition to the above-mentioned methods. This method will be described in detail.

In the case that the protection layer 8 made of carbon is formed on the seed crystal 4, the surface of the seed crystal 4 on which the protection layer 8 is to be formed is polished to be a mirror finished surface, and is washed in a solution including hydrogen fluoride, nitric acid, or the like as a surface preparation treatment. Thereafter, the seed crystal 4 is disposed in a graphite crucible so that the surface on which the protection layer 8 is to be formed is on an upper side thereof. The seed crystal 4 is heated at over than 2000° C. in an atmosphere including inert gas such as argon gas, whereby a carbon layer is closely formed on the seed crystal 4. For example, in a case that the seed crystal 4 is heated at in a range of 2300° C. to 2400° C. approximately for 2 hours in the argon gas atmosphere with a pressure of 500 Torr, the thickness of the carbon layer is approximately in a range of 10 $\mu$m to 80 $\mu$m. Here, the seed crystal has a thickness of approximately 1 mm. Thus obtained carbon layer was analyzed by X-ray diffraction. As the result, it was observed that the carbon layer is made of graphite having a strong C plane orientation with respect to the C plane of SiC, and a degree of orientation a of the graphite is approximately 0.91. Here, the degree of orientation $\alpha$ of graphite is expressed by the following formula;

$$\alpha = P - P_0/(1 - P_0)$$

wherein $P_0$ is a ratio of X-ray diffraction intensities in a graphite-3R crystal structure, determined by JCPDS (Joint Committee of Powder Diffraction Standards), which is expressed by the following formula (1);

$$P_0 = I_0(0003)/(I_0(0003) + I_0(10\bar{1}1) + I_0(01\bar{1}2)) \qquad (1)$$

According to JCPDS, $P_0$ has the following value.

$$P_0 = 100/(100 + 11 + 9) = 100/120 = 0.833$$

Further, P is a ratio of X-ray diffraction intensities measured by X-ray diffraction analysis, which is expressed by the following formula (2);

$$P = I(0003)/(I(0003) + I(10\bar{1}1) + I(01\bar{1}2)) \qquad (2)$$

In the graphite having the C plane orientation with respect to the C plane of SiC, i.e., in the graphite having the C plane in parallel with the C plane of SiC, heat and substance are unlikely to be transmitted in a C axial direction. Therefore, the graphite having the C plane orientation can efficiently prevent mass transfer in the C axial direction thereof. That is, the carbon layer having the C plane orientation can prevent mass transfer in the thickness direction thereof. In the present invention, it is desirable that the degree of orientation $\alpha$ is 0.80 or more, whereby the effect of preventing mass transfer in the carbon layer is further enhanced.

Next, lapping and polishing processes are performed on the crystal growth surface of the seed crystal 4 to expose SiC of the seed crystal 4. Further, the crystal growth surface is selectively etched by reactive ion etching (RIE) to remove a damage layer produced in the lapping and the polishing processes, whereby the seed crystal 4 on which single-crystal SiC 5 is to be grown is obtained.

Next, the seed crystal 4 is bonded to the base 21 so that the carbon layer contacts the base 21, and then, it is disposed in the growth apparatus. Here, the carbon layer has a thickness of 70 µm. In this state, single-crystal SiC 5 is grown on the seed crystal 4. As growth conditions, a temperature of the seed crystal 4 is preferably 2230° C., a temperature of the source material powder is preferably 2300° C., a temperature gradient is preferably 7° C./cm², and an atmosphere in the growth apparatus includes argon gas with a pressure of preferably 1 Torr. As the growth surface of the seed crystal 4, a (0001) plane of SiC is adopted.

Under these growth conditions, single-crystal SiC 5 is grown on the seed crystal 4 for 24 hours, thereby forming a SiC single-crystal ingot having a thickness of approximately 8 mm. The SiC single-crystal ingot is sliced along the C plane thereof, whereby a wafer is produced. The wafer is etched in a solution of potassium hydroxide at 500° C. for 10 minutes to measure a micro-pipe defect density. As the result, the micro-pipe defect density in the wafer is 2 pieces per 1 cm².

As a comparative example to the first embodiment, single-crystal SiC was grown on the seed crystal 4 which was directly bonded to the base 21 without having the protection layer 8. The other growth conditions were the same as those in the first embodiment. Thus obtained SiC ingot 15 had a thickness of 8 mm. However, when observing a vertical cross-section of the SiC ingot 15, it was founded that a recrystallized layer having a thickness of approximately 4 mm was produced between the seed crystal 4 and the SiC ingot 5 as indicated by oblique lines in FIG. 4. A part of the seed crystal 4 was also recrystallized to form a part of the recrystallized layer. Further, a plurality of micro-pipe defects 7 extended from the recrystallized layer into the SiC ingot 15. A wafer was produced from the SiC ingot 15 in the same manner as in the first embodiment and the micro-pipe defect density of the wafer was measured. As the result, the micro-pipe defect density was approximately 100 pieces per 1 cm². Consequently, it has been confirmed that the wafer produced in the first embodiment is much superior in quality than the wafer produced in the comparative example.

In a case that the protection layer 8 made of the high melting point metals, carbide of the high melting point metals or the like is formed on the seed crystal 4, the following surface preparations are performed on the seed crystal 4 in advance. That is, both upper and lower surfaces of the seed crystal 4 are polished to be mirror finished surface, and damage layers of the seed crystal 4 produced by polishing are removed. Thereafter, chemical washing using hydrogen fluoride, nitric acid or the like is performed on the seed crystal 4. After these surface preparation treatments, the protection layer 8 made of required material is formed on the surface of the seed crystal 4 except for the crystal growth surface in a sputtering apparatus or the like. In this case, the crystal growth surface is coated with wax not to be covered by the protection layer 8. The wax is removed from the seed crystal 4 by washing after the deposition of the protection layer 8.

The protection layer 8 needs to have a enough thickness to prevent the sublimation and the diffusion of material from the seed crystal 4. The thickness of the protection layer 8 differs depending on the material constituting the protection layer 8, however, it is usually desired to be more than 0.1 µm. More preferably, the thickness is more than 10 µm, thereby reliably preventing recrystallization in the seed crystal 4.

The seed crystal 4 having the protection layer 8 is bonded to the base 21 so that the protection layer 8 contacts the base 21, and then single-crystal SiC 5 is grown on the seed crystal 4 by a conventionally known method. As a result, recrystallization in the seed crystal 4 is prevented, whereby quality and yield factor of single crystal SiC 5 is largely improved.

Next, a second embodiment according to the present invention will be described referring to drawings.

Figure 5:
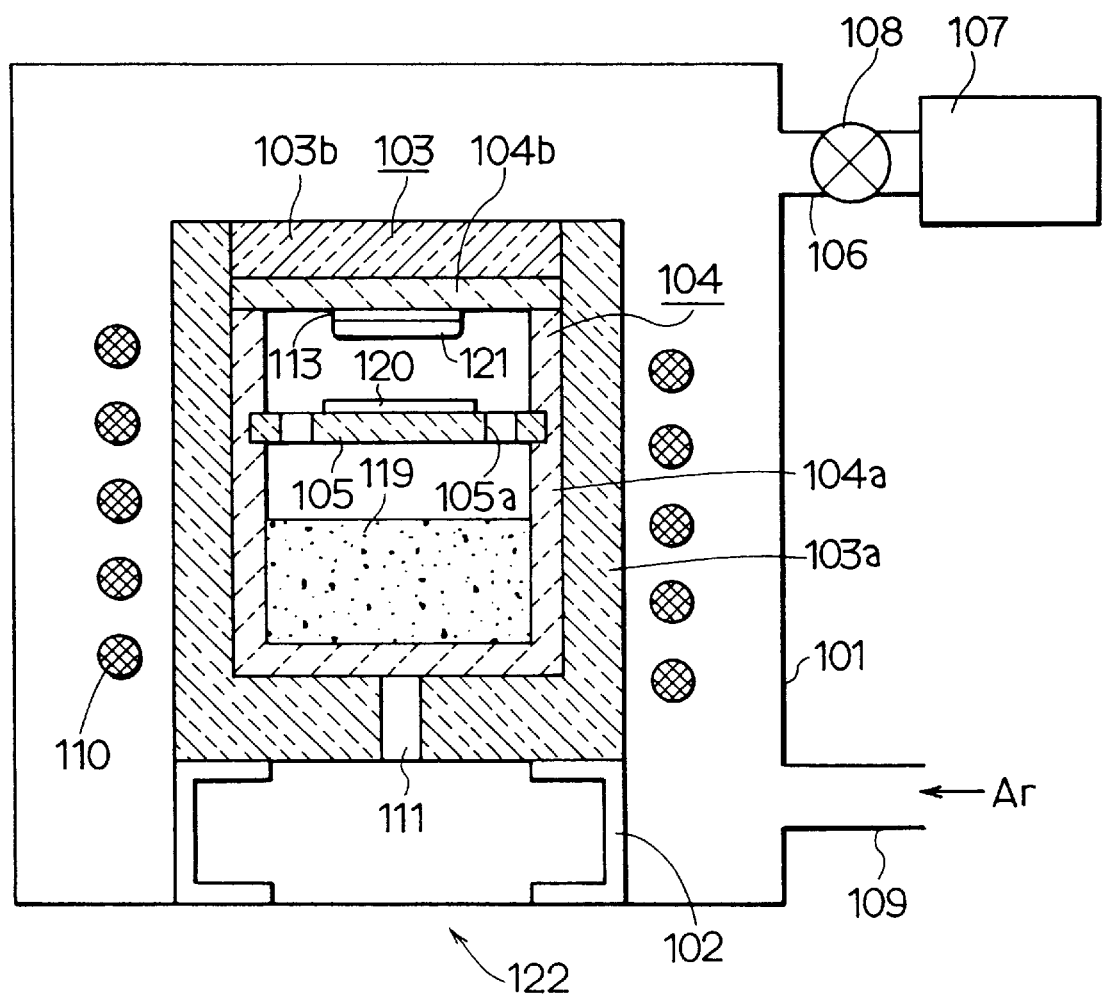
FIG. 5 is a cross-sectional view showing a growth apparatus for producing single-crystal silicon carbide in a second embodiment according to the present invention.

FIG. 5 shows a crystal growth apparatus 122 employed in the second embodiment for forming single-crystal SiC by the sublimation method.

As shown in FIG. 5, a base member 102 is provided in a vacuum chamber 101, and a graphite crucible 104 covered by a heat insulating material 103 is disposed on the base member 102. The graphite crucible 104 includes a crucible body 104a having an opening at the upper face thereof and a crucible lid 104b for closing the opening of the crucible body 104a. The crucible lid 104b functions as a base for supporting a SiC single-crystal layer 113 which functions as a seed crystal. Further, a supporting plate 105 made of graphite is fixed to the graphite crucible 104. A mass of silicon 120 is disposed at the center of the supporting plate 105, while through holes 105a are formed at the periphery of the supporting plate 105. SiC source material powder 119 is put at the bottom of the graphite crucible 104, and the supporting plate 105 is located on an upper side of SiC source material powder 119.

The heat insulating material 103 has a main portion 103a for covering the bottom face and the side face of the graphite crucible 104, and a lid portion 103b for covering the upper portion of the graphite crucible 104.

The vacuum chamber 101 communicates with a vacuum pump 107 through an exhaust pipe 106 so that the inside of the vacuum chamber 101 is evacuated by the vacuum pump 107. An exhaust valve 108 is provided in the exhaust pipe 106. The vacuum chamber 101 further communicates with an inert gas introducing pipe 109 so that argon gas as the inert gas is introduced into the vacuum chamber 101 through the inert gas introducing pipe 109.

An induction coil 110 is provided at the outer circumferential side of the heat insulating material 103 in the vacuum chamber 101. Electrical power is supplied to the induction coil 110 from a high frequency power supply so that the graphite crucible 104 is heated by induction heating.

The heat insulating material 103 has a temperature measurement hole 111 at the bottom face thereof so that the temperature of the crucible body 104a can be measured. That is, light is taken out from the bottom face of the crucible body 104a through the temperature measurement hole 111 to enter a radiation pyrometer, so that the temperature of the crucible body 104a can be measured by the radiation pyrometer.

Next, a method of manufacturing single-crystal SiC will be described.

Figure 6:
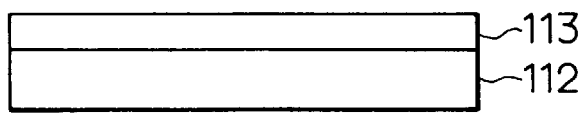
FIG. 6 is a cross-sectional view for explaining a step of producing single-crystal silicon carbide in the second embodiment.

Firstly, as shown in FIG. 6, a silicon wafer 112 having a diameter of 4 inches is prepared. The SiC single-crystal layer 113 is epitaxially grown on the silicon wafer 112 by a chemical vapor deposition (CVD) method. In more detail, a chemical reaction occurs between gas supplying a carbon element such as methane gas and gas supplying a silicon element such as silan gas, thereby forming the SiC single-crystal layer 113 in the CVD process. The thickness of the SiC single-crystal layer 113 is approximately 10 µm.

Figure 7:
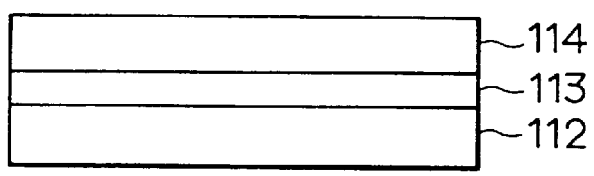
FIG. 7 is a cross-sectional view for explaining a step of producing single-crystal silicon carbide in the second embodiment.

As shown in FIG. 7, on the surface of the SiC single-crystal layer 113, a first sacrifice layer 114 is formed by the CVD method. The first sacrifice layer 114 is made of polycrystal SiC, the thickness of which is approximately 100 µm.

Figure 8:
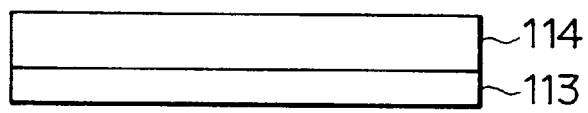
FIG. 8 is a cross-sectional view for explaining a step of producing single-crystal silicon carbide in the second embodiment.

Thereafter, as shown in FIG. 8, the silicon wafer 112 having the SiC single-crystal layer 113 and the first sacrifice layer 114 is immersed in a solution including hydrofluoric acid and nitric acid. As a result, the silicon wafer 112 is resolved, whereby only the SiC single-crystal layer 113 and the first sacrifice layer 114 remain. In the removing process of the silicon wafer 112, the first sacrifice layer 114 functions as a reinforcement member, thereby preventing damage to the SiC single-crystal layer 113.

Thus the silicon wafer 112 is removed by a chemical technique using the solution capable of resolving silicon. In this embodiment, although the chemical technique using the solution of hydrofluoric acid and nitric acid is employed, a mechanical polishing technique may be employed instead of the chemical technique.

Figure 9:
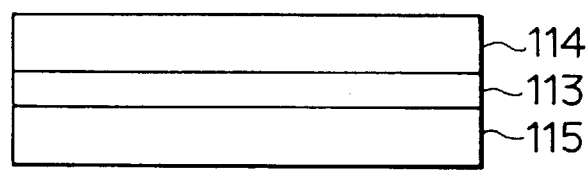
FIG. 9 is a cross-sectional view for explaining a step of producing single-crystal silicon carbide in the second embodiment.

Successively, as shown in FIG. 9, on the surface of the SiC single-crystal layer 113 which is exposed by removing the silicon wafer 112, a second sacrifice layer 115 made of polycrystal SiC is formed by the CVD method.

In this way, the SiC single-crystal layer 113 covered by the first and second sacrifice layers 114 and 115 can be obtained.

This SiC single-crystal layer 113 having the first and second sacrifice layers 114 and 115 is heated at 2300° C. for 2 hours in an argon gas atmosphere with a pressure of 500 Torr. As a result, carbonized layers 116 and 117 are formed on the first and second sacrifice layers 114 and 115 by carbonizing the surface portions of the first and second sacrifice layers 114 and 115, respectively. Each thickness of the carbonized layers 116 and 117 is approximately 20 $\mu$m. In this process, the first and second sacrifice layers 114 and 115 prevent the SiC single-crystal layer 113 from being carbonized, whereby the SiC single-crystal layer 113 can keep its thickness.

Figure 11:
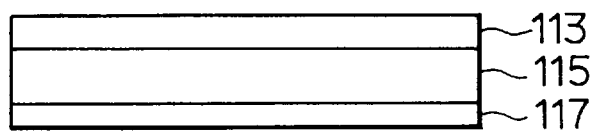
FIG. 11 is a cross-sectional view for explaining a step of producing single-crystal silicon carbide in the second embodiment.

Thereafter, as shown in FIG. 11, the carbonized layer 116 formed on the first sacrifice layer 114 is removed by mechanical polishing along with the first sacrifice layer 114. As a result, one of the surfaces of the SiC single-crystal layer 113 is exposed.

Thus the surface of the SiC single-crystal layer 113 is exposed, while on the other surface of the SiC single-crystal layer 113 is formed the second sacrifice layer 115 and the carbonized layer 117. In this way, a SiC seed crystal substrate composed of the SiC single-crystal layer 113, the second sacrifice layer 115 and the carbonized layer 117 which are laminated in this order is obtained.

Figure 12:
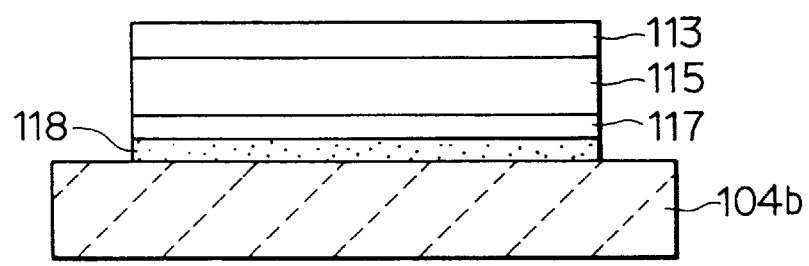
FIG. 12 is a cross-sectional view for explaining a step of producing single-crystal silicon carbide in the second embodiment.

Next, the crucible lid 104b is detached from the crystal growth apparatus 122 shown in FIG. 5. As shown in FIG. 12, the surface of the carbonized layer 117 is bonded to the crucible lid 104b through adhesives 118, whereby the SiC single-crystal layer 113 is fixed to the crucible lid 104b.

The surface of the carbonized layer 117 may be fixed to the crucible lid 104b with a direct junction without using the adhesives 118.

The crucible lid 104b is mounted in the crystal growth apparatus 122 again so that the SiC single-crystal layer 113 is disposed on the lower face of the crucible lid 104b in the crystal growth apparatus 122 as shown in FIG. 5.

The graphite crucible 104 contains the SiC source material powder 119 of approximately 100 g. To obtain the SiC source material powder 119, SiC powder put on the market as abrasives, the average particle size of which is approximately 500 $\mu$m, is heated at 1800° C.–2000° C. under vacuum in advance. Further, the mass of silicon 120 is put on the supporting plate 105. Although the mass of silicon 120 is a plate obtained from a silicon wafer, it may be silicon powder.

In this state, the vacuum chamber 101 is evacuated to a vacuum level of $10^{-3}$ to $10^{-4}$ Torr by the vacuum pump 107 through the exhaust pipe 106 and the exhaust valve 108.

Next, electrical power is supplied to the induction coil 110 from the high frequency power supply, thereby heating the graphite crucible 104 by induction heating. The temperature of the graphite crucible 104 is measured by the radiation pyrometer through the temperature measurement hole 111. After the temperature is raised to 1200° C., argon gas is introduced into the vacuum chamber 101 through the inert gas introducing pipe 109 until the pressure in the vacuum chamber 101 becomes 500 Torr.

Thereafter, electrical power is supplied to the induction coil 110 again to raise the temperature of the graphite crucible 104 to in a range of 2300° C. to 2350° C. so that the temperature of the SiC source material powder 119 reaches its sublimation temperature. The temperature of the SiC single-crystal layer 113 is controlled by a relative position between the graphite crucible 104 and the induction coil 110 so as to be lower by 50° C.–350° C. than that of the SiC source material powder 119. In a state that the temperatures of the SiC source material powder 119 and the SiC single-crystal layer 113 are stable, the pressure in the vacuum chamber 101 is reduced by the vacuum pump 107. The reduction of the pressure in the vacuum chamber 101 is accompanied by the sublimation of the SiC source material powder 119, whereby crystal growth of SiC starts. The pressure in the vacuum chamber 101 is controlled to be in a range of 0.5 Torr to 100 Torr as a growth pressure. While the crystal growth continues, argon gas is introduced into the vacuum chamber 101 at 10 l/min and the pressure in the vacuum chamber 101 is controlled by adjusting an opening degree of the exhaust valve 108.

The gas sublimated from the SiC source material powder 119 reaches the surface of the SiC single-crystal layer 113 to progress the crystal growth of SiC. In this case, a difference in temperature between the SiC single-crystal layer 113 and the SiC source material powder 119 functions as a driving force for moving the sublimated gas to the surface of the SiC single-crystal layer 113. After single-crystal SiC grows for 5 hours, the supply of electric power to the induction coil 110 is stopped and argon gas is introduced to the vacuum chamber 101. Accordingly, the temperatures of the SiC single-crystal layer 113 and the SiC source material powder 119 are lowered to stop the growth of single-crystal SiC.

Figure 13:
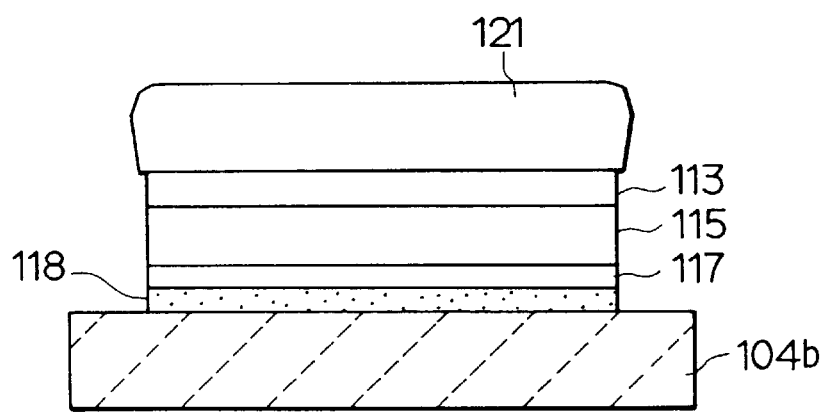
FIG. 13 is a cross-sectional view for explaining a step of producing single-crystal silicon carbide in the second embodiment.

Consequently, as shown in FIG. 13, an SiC single-crystal ingot 121 is formed on the SiC single-crystal layer 113. The SiC single-crystal ingot 121 has a thickness of approximately 2 mm and a diameter of approximately 4 inches. In this way, the SiC single-crystal ingot 121 having a large diameter can be obtained. That is, the SiC source material powder 119 is sublimated in the inert gas atmosphere in the graphite crucible 104, while the temperature of the SiC single-crystal layer 113 is controlled to be a little lower than that of the SiC source material powder 119. As a result, the SiC single-crystal ingot 121 is formed on the SiC single-crystal layer 113.

In the crystal growth process, the carbonized layer 117 formed on the second sacrifice layer 115 prevents mass transfer inside the SiC single-crystal layer 113, thereby preventing occurrence of defects in the SiC single-crystal layer 113 and the SiC single-crystal ingot 121 formed on the SiC single-crystal layer 113.

As opposed to this, in the case that the second sacrifice layer 115 and the carbonized layer 117 are not formed on the SiC single-crystal layer 113, the following deficiencies occur. In this case, the SiC single-crystal layer 113 is generally fixed to the crucible lid 104b by utilizing the adhesives 118. However, it is difficult to bond the SiC single-crystal layer 113 to the crucible lid 104b uniformly, and it is likely to arise spaces between the SiC single-crystal layer 113 and the crucible lid 104b. Between the portions where the spaces are generated and the other portions where the SiC single-crystal layer 103 closely adheres to the crucible lid 104b, a difference in temperature occurs due to a difference in heat conductivity therebetween during the crystal growth. As a result, mass transfer from a higher temperature portion to a lower temperature portion occurs, giving rise to defects generated by polycrystallization and the like in the SiC single-crystal layer 113. The defects generated in the SiC single-crystal layer 113 are succeeded in the SiC single-crystal ingot 121, so that a defect density of the SiC single-crystal ingot 121 becomes large. As opposed to this, when the carbonized layer 117 is formed on the SiC single-crystal layer 113 through the second sacrifice layer 115, the temperature on the surface of the SiC single-crystal layer 113 becomes uniform due to the carbonized layer 117. At the same time, the carbonized layer 117 functions as a barrier layer for prohibiting mass transfer inside the SiC single-crystal layer 113. Therefore, the SiC single-crystal ingot 121 can be formed with high quality and without having any defects.

Further, in the case that the first and second sacrifice layers 114 and 115 are not formed on the SiC single-crystal layer 113, the SiC single-crystal layer 113 itself is carbonized to form the carbonized layer 117. Accordingly, the following deficiency occur. That is, the thickness of the SiC single-crystal layer 113 formed by the CVD method is approximately 10 μm, and the thickness of the carbonized layer 117 is more than 10 μm. This means that the SiC single-crystal layer 113 is entirely carbonized in order to form the carbonized layer having a sufficient thickness, whereby the SiC single-crystal layer 113 disappears. As opposed to this, in the second embodiment, because the carbonized layer 117 is formed by carbonizing the second sacrifice layer 115 formed on the SiC single-crystal layer 113, the SiC single-crystal layer 113 is not carbonized and can kept its thickness. Therefore, the high-quality SiC single-crystal ingot 121 can be formed on the SiC single-crystal layer 113.

Moreover, when the SiC single-crystal ingot 121 is growing, the mass of solid silicon 120 is gasified so that a partial pressure of silicon rises in the vacuum chamber 101. As a result, it is prevented that silicon element escapes from the surface of the SiC single-crystal layer 113 in the beginning of the crystal growth, so that the surface of the SiC single-crystal layer 113 is prevented from being carbonized.

Figure 14:
FIG. 14 is a cross-sectional view for explaining a step of producing single-crystal silicon carbide in the second embodiment.

As shown in FIG. 14, thus obtained SiC single-crystal ingot 121 is removed from the crucible lid 104b, and then, it is sliced and is polished to form a semiconductor substrate. In this process, the SiC single-crystal layer 13, the second sacrifice layer 115 and the like are removed. The substrate obtained from the SiC single-crystal ingot 121 can be used for a semiconductor device such as a vertical type MOSFET, a pn diode, a Shottky diode or the like, which is operable with high electric power.

Further, in the manufacturing process of producing the SiC single-crystal ingot 121, because at least one of the first and second sacrifice layers 114 and 115 remains on the SiC single-crystal layer 113, the sacrifice layer functions as a reinforcement member for preventing damages provided to the SiC single-crystal layer 113 under its handling.

The second embodiment according to the present invention has the following features (A) to (E).

(A) After the SiC single-crystal layer 113 is covered by the first and second sacrifice layers 114 and 115, the carbonized layers 116 and 117 are formed on the first and second sacrifice layers 114 and 115 by carbonizing the surface portions of the first and second sacrifice layers 114 and 115, respectively. Therefore, the SiC single-crystal layer 113 is prevented from being carbonized. That is, because the first and second sacrifice layers 114 and 115 are carbonized, the thickness of the SiC single-crystal layer 113 is not decreased by the carbonization.

Next, after one of the surfaces of the SiC single-crystal layer 113 is exposed by removing the first sacrifice layer 114 and the carbonized layer 116, the SiC single-crystal layer 113 is fixed to the crucible lid 104b in the crystal growth apparatus 122 with the carbonized layer 117 contacting the crucible lid 104b. Thereafter, the SiC single-crystal ingot 121 is formed on the surface of the SiC single-crystal layer 113 by the sublimation method. In this case, the carbonized layer 117 equalizes the temperature distribution in the SiC single-crystal layer 113, while functioning as the barrier layer. Therefore, mass transfer inside the SiC single-crystal layer 113 is prevented. As a result, any defects are not generated in the SiC single-crystal ingot 121 as well as inside the SiC single-crystal layer 113, thereby resulting in high quality of the SiC single-crystal ingot 121. Further, because the SiC single-crystal ingot 121 is grown on the SiC single-crystal layer 113 by the sublimation method, the SiC single-crystal ingot 121 can have a sufficient thickness for a semiconductor substrate. Further, the SiC single-crystal ingot 121 can be grown successively, thereby resulting in mass production and low cost.

The SiC single-crystal layer 113 formed on the silicon wafer 112 has the same diameter as that of the silicon wafer 112. In the present level of the art, it is easy to get the silicon wafer having a diameter of 8 to 10 inches. Therefore, the SiC single-crystal layer 113 having the diameter of 8 to 10 inches can be formed. That is, the SiC single-crystal ingot 121 can be obtained with the large diameter of 8 to 10 inches.

(B) The first and second sacrifice layers 114 and 115, and the carbonized layers 116 and 117 are formed in the following way. That is, the SiC single-crystal layer 113 is grown on the silicon wafer 112, and on the SiC single-crystal layer 113 is formed the first sacrifice layer 114 made of SiC. Thereafter, the silicon wafer 112 is removed. In this case, the first sacrifice layer 114 functions as the reinforcement member for protecting the SiC single-crystal layer 113 from being damaged. On the surface of the SiC single-crystal layer 113 which is exposed by removing the silicon wafer 112, the second sacrifice layer 115 made of SiC is formed. Further, the carbonized layers 116 and 117 are formed on the first and second sacrifice layers 114 and 115 by carbonizing the surface portions of the first and second sacrifice layers 114 and 115, respectively. In this process, the SiC single-crystal layer 113 is prevented from being carbonized due to the first and second sacrifice layers 114 and 115.

(C) The first and second sacrifice layers 114 and 115 are made of polycrystal SiC which can be formed easier than single-crystal SiC.

(D) The process of forming the carbonized layers 116 and 117 on the first and second sacrifice layers 114 and 115 is performed in an atmosphere including inert gas. Therefore, the carbonized layers 116 and 117 can be formed easily.

(E) In the sublimation method, the SiC source material powder 119 is sublimated in the graphite crucible 104, and the SiC single-crystal ingot 121 is grown on the SiC single-crystal layer 113 of which the temperature is lower than that of the SiC source material powder 119. By adopting this method, the SiC single-crystal ingot 121 can be formed with a sufficient thickness suitable for a semiconductor substrate.

In the second embodiment, although the sacrifice layers 114 and 115 are made of polycrystal SiC, it may be made of single-crystal SiC or amorphous SiC.

Figure 10:
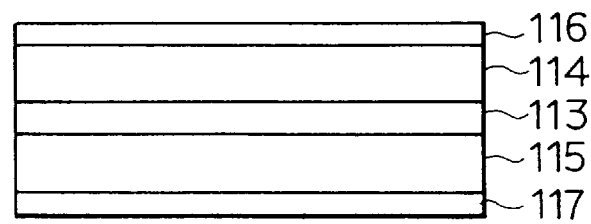
FIG. 10 is a cross-sectional view for explaining a step of producing single-crystal silicon carbide in the second embodiment.

Further, as shown in FIGS. 10 and 11, after the carbonized layers 116 and 117 are formed on the first and second sacrifice layers 114 and 115, the first sacrifice layer 114 and the carbonized layer 116 formed on the first sacrifice layer 114 are removed. However, after the first and second sacrifice layers 114 and 115 are formed on the SiC single-crystal layer 113, the carbonized layer 117 may be formed only on the second sacrifice layer 115 in a state that the first sacrifice layer 114 is masked. Thereafter, the first sacrifice layer 114 may be removed.

Further, after the carbonized layers 116 and 117 are formed on the first and second sacrifice layers 114 and 115, the second sacrifice layer 115 and the carbonized layer 117 formed on the second sacrifice layer 115 may be removed instead of the first sacrifice layer 114 and the carbonized layer 116.

Although the SiC single-crystal layer 113 is formed on the silicon wafer 112 by the CVD method, it may be formed by a molecular beam epitaxy (MBE) method or physical deposition methods represented by a sputtering method. In the MBE method, carbon and solid silicon, or solid SiC are evaporated to form the SiC single-crystal layer 113. Further, the SiC single-crystal layer 113 may be formed through a solid-phase growth. To put in detail, after carbon ions are implanted into the silicon wafer 112 made of single-crystal silicon, the silicon wafer 112 is heated. As a result, the SiC single-crystal layer 113 can be formed on the silicon wafer 112 through the solid-phase growth.

In the second embodiment, on the surface of the SiC single-crystal layer 113 which is exposed by removing the silicon wafer 112, the second sacrifice layer 115 is formed, while on the other surface of the SiC single-crystal layer is formed the first sacrifice layer 114 in advance. Thereafter, the first and second sacrifice layers 114 and 115 are carbonized to form the first and second carbonized layers 116 and 117, respectively. However, before removing the silicon wafer 12, the first carbonized layer 116 may be formed on the first sacrifice layer. Thereafter, the silicon wafer 112 is removed to expose the surface of the SiC single-crystal layer 113. In this case, this exposed surface of the SiC single-crystal layer 113 can function as a crystal growth surface on which the SiC single-crystal ingot 121 is to be formed.

In the second embodiment, the carbonized layer 117 functions as a protection layer described in the first embodiment. As mentioned above, because the SiC single-crystal layer 113 does not have the thickness enough to be carbonized to form the carbonized layer 117, at least one sacrifice layer 115 is needed to form the carbonized layer 117. However, a layer other than the carbonized layer may be used as the protection layer, and in this case, by employing the protection layer having a sufficient thickness, the sacrifice layer may be omitted.

A sintered material can be used as the SiC source material in addition to the SiC source material powder.

In the above-mentioned embodiments, although the sublimation method is employed to supply source gas for single-crystal SiC to the surface of the seed crystal, the other methods are also acceptable. That is, the source gas is not limited to the sublimated gas sublimated from the SiC source material, and it may be another source gas controlled by another method different from the sublimation method.

As material of crucible, high melting point metals such as tungsten, tantalum or the like can be adopted in addition to graphite.

while the present invention has been shown and described with reference to the foregoing preferred embodiments, it will be apparent to those skilled in the art that changes in form and detail may be made therein without departing from the scope of the invention as defined in the appended claims.

What is claimed is:

1. A method of producing single crystals on a seed crystal, comprising steps of:

forming a protection layer on an opposite surface with respect to a growth surface of the seed crystal on which the single crystals are to be formed; and supplying a source gas of the single crystals to the seed crystal, thereby forming the single crystals on the growth surface of the seed crystal, wherein the protection layer is made of a material stable in the step of forming the single crystals so as to prevent mass transfer in the seed crystal.

2. A method of producing single crystals on a seed crystal according to claim 1, wherein;

the protection layer is further formed on an entire area of the seed crystal including the growth surface except for an area of the growth surface on which the single crystals are to be formed.

3. A method of producing single crystals on a seed crystal according to claim 1, wherein;

the protection layer keeps its solid phase at 2300 ° C.

4. A method of producing single crystals on a seed crystal according to claim 3, wherein;

the protection layer is made of carbon.

5. A method of producing single crystals on a seed crystal according to claim 3, wherein;

the protection layer is composed of at least one selected from a group consisting of high melting point metals, and carbide, boride, and nitride of the high melting point metals.

6. A method of producing single crystals on a seed crystal according to claim 5, wherein;

the high melting point metals include tantalum, tungsten, niobium, molybdenum, rhenium, osmium, and iridium.

7. A method of producing single crystals on a seed crystal according to claim 1, wherein;

the seed crystal is made of silicon carbide.

8. A method of producing single crystals on a seed crystal according to claim 7, wherein;

the protection layer is made of graphite having a C plane orientation so that a C plane of the protection layer is parallel to a C plane of the seed crystal.

9. A method of producing single crystals on a seed crystal according to claim 1, further comprising the steps of:

forming a sacrifice layer on the growth surface of the seed crystal before the step of forming the protection layer.

10. A method of producing single crystals on a seed crystal according to claim 9, wherein:

the protection layer is formed on the seed crystal through the sacrifice layer by carbonizing a surface portion of the sacrifice layer in an atmosphere including inert gas.

11. A method of producing single crystals on a seed crystal according to claim 10, wherein:

the single crystals are made of silicon carbide; and the sacrifice layer is made of poly-crystal silicon carbide.

12. A method of producing single crystals on a seed crystal according to claim 1, further comprising the steps of:

forming first and second sacrifice layers on the growth surface and on the opposite surface of the seed crystal before forming the protection layer; and removing the first sacrifice layer on the growth surface of the seed crystal, after forming the protection layer on the opposite surface of the seed crystal through the second sacrifice layer.

13. A method of producing single crystals on a seed crystal according to claim 12, wherein the protection layer is formed on the second sacrifice layer by carbonizing a surface portion of the second sacrifice layer.

14. A method of producing single crystals on a seed crystal according to claim 13, wherein in the step of forming the protection layer, the first sacrifice layer is masked so that it is prevented from being carbonized.

15. A method of producing single crystals on a seed crystal according to claim 12, wherein:

in the step of forming the protection layer, first and second protection layers are respectively formed on the first and second sacrifice layers; and in the step of removing the first sacrifice layer, the first protection layer is removed together with the first sacrifice layer so that the growth surface of the seed crystal is exposed.

16. A method of producing single crystals on a seed crystal according to claim 15, further comprising the steps of:

fixing the seed crystal on a base through the second sacrifice layer and the second protection layer, after the step of removing the first sacrifice layer; and disposing the base fixing the seed crystal in a single-crystal growth apparatus, before the step of supplying source gas.

17. A method of producing single crystals on a seed crystal according to claim 15, wherein the first and second protection layers are formed on the first and second sacrifice layers by carbonizing surface portions of the first and second sacrifice layers.

18. A method of producing single crystals on a seed crystal according to claim 15, wherein:

the first and second protection layers are formed on the first and second sacrifice layers by heating in an atmosphere including inert gas.

19. A method of producing single crystals on a seed crystal according to claim 12, wherein the step of forming the first and the second sacrifice layers on the seed crystal includes the steps of:

forming the seed crystal on a silicon single-crystal substrate;

forming one of the first and second sacrifice layers on one of the surfaces of the seed crystal;

removing the silicon single-crystal substrate; and forming another of the first and second sacrifice layers on the other of the surfaces of the seed crystal which is exposed by removing the silicon single-crystal substrate.

20. A method of producing single crystals on a seed crystal according to claim 12, wherein:

the single crystals is made of silicon carbide; and the first and second sacrifice layers are made of polycrystal silicon carbide.

21. A method of producing single crystals on a seed crystal according to claim 12, wherein in the step of supplying the source gas to the seed crystal, the source gas is obtained by sublimating silicon carbide source material, while a temperature of the seed crystal is controlled to be lower than a temperature of the silicon carbide source material.

* * * * *